United States Patent
Kato

(10) Patent No.: US 8,477,535 B2
(45) Date of Patent: Jul. 2, 2013

(54) SEMICONDUCTOR DEVICE

(75) Inventor: Tamiyu Kato, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 175 days.

(21) Appl. No.: 13/180,189

(22) Filed: Jul. 11, 2011

(65) Prior Publication Data

US 2012/0033495 A1 Feb. 9, 2012

(30) Foreign Application Priority Data

Aug. 6, 2010 (JP) ................................. 2010-176993

(51) Int. Cl.
  *G11C 16/04* (2006.01)
(52) U.S. Cl.
  USPC ................................. 365/185.05; 365/185.18
(58) Field of Classification Search
  USPC ............................ 365/185.05, 185.18, 185.24
  See application file for complete search history.

(56) References Cited

U.S. PATENT DOCUMENTS

| | | | | |
|---|---|---|---|---|
| 6,696,330 | B2* | 2/2004 | Forbes et al. | 438/210 |
| 6,850,449 | B2* | 2/2005 | Takahashi | 365/222 |
| 7,480,168 | B2* | 1/2009 | Arimoto et al. | 365/149 |
| 2010/0080058 | A1 | 4/2010 | Fujito et al. | |

FOREIGN PATENT DOCUMENTS

JP 2008-117510 5/2008

* cited by examiner

*Primary Examiner* — Vu Le
(74) *Attorney, Agent, or Firm* — McDermott Will & Emery LLP

(57) ABSTRACT

A semiconductor device is provided which comprises a nonvolatile memory capable of storing complementary data and performing a more accurate blank check than ever before.

A nonvolatile memory comprises a memory array having a plurality of twin cells arranged therein for storing complementary data, and first to third determination units. The first determination unit determines, for each of the twin cells selected by a selection circuit, whether or not a first condition that the threshold voltage of one memory cell is higher than a reference value commonly set and the threshold voltage of the other memory cell is lower than the reference value is satisfied. The second determination unit determines whether or not a second condition that all the selected twin cells satisfy the first condition is satisfied. The third determination unit determines, based on the determination result of the second determination unit, whether or not each of the selected twin cells is in a blank state.

6 Claims, 15 Drawing Sheets

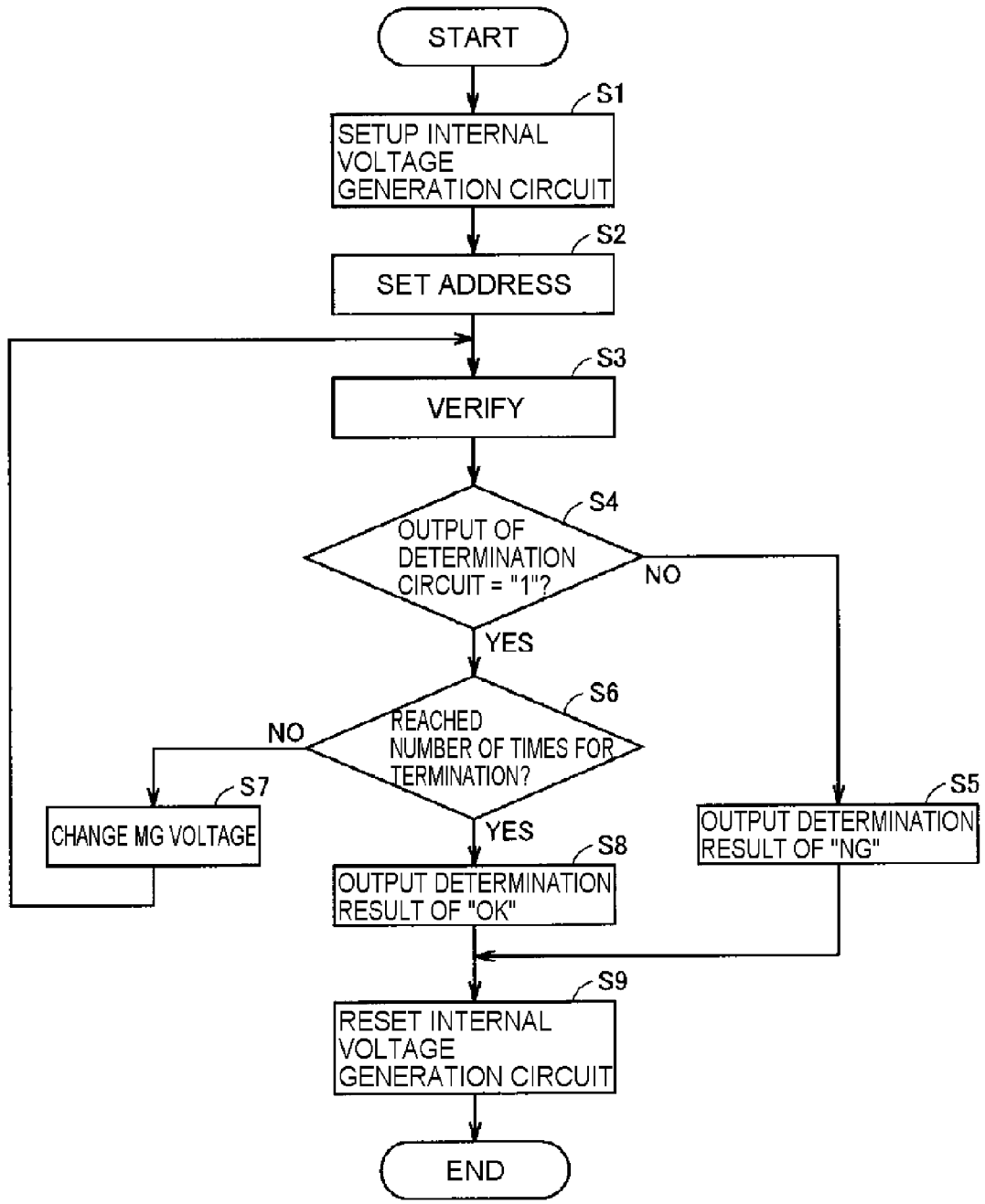

FIG. 10A

|  | VL1 | VL2 | VL3 | DETERMINATION RESULT |
|---|---|---|---|---|
| SHALLOW Vth(SH) | ERASE | ERASE | ERASE | ERASE |
| DEEP Vth(DP) | ERASE | ERASE | ERASE | ERASE |

FIG. 10B

|  | VL1 | VL2 | VL3 | DETERMINATION RESULT |
|---|---|---|---|---|
| SHALLOW Vth(SH) | ERASE | ERASE | ERASE | ERASE |
| DEEP Vth(DP) | ERASE | ERASE | ERASE | ERASE |

FIG. 10C

|  | VL1 | VL2 | VL3 | DETERMINATION RESULT |
|---|---|---|---|---|
| SHALLOW Vth(SH) | WRITE | WRITE | WRITE | WRITE |
| DEEP Vth(DP) | WRITE | WRITE | WRITE | WRITE |

FIG. 10D

|  | VL1 | VL2 | VL3 | DETERMINATION RESULT |
|---|---|---|---|---|
| SHALLOW Vth(SH) | ERASE | WRITE | ERASE | WRITE |
| DEEP Vth(DP) | ERASE | ERASE | WRITE | WRITE |

*FIG. 11A*

|  | VL1 | VL2 | VL3 | DETERMINATION RESULT |
|---|---|---|---|---|
| SHALLOW Vth(SH) | ERASE | ERASE | ERASE | ERASE |
| DEEP Vth(DP) | ERASE | ERASE | ERASE | ERASE |

*FIG. 11B*

|  | VL1 | VL2 | VL3 | DETERMINATION RESULT |
|---|---|---|---|---|
| SHALLOW Vth(SH) | ERASE | ERASE | WRITE | ? |
| DEEP Vth(DP) | ERASE | ERASE | ERASE | ERASE |

*FIG. 11C*

|  | VL1 | VL2 | VL3 | DETERMINATION RESULT |
|---|---|---|---|---|
| SHALLOW Vth(SH) | WRITE | WRITE | WRITE | WRITE |
| DEEP Vth(DP) | WRITE | WRITE | WRITE | WRITE |

*FIG. 11D*

|  | VL1 | VL2 | VL3 | DETERMINATION RESULT |
|---|---|---|---|---|
| SHALLOW Vth(SH) | ERASE | WRITE | WRITE | ? |
| DEEP Vth(DP) | ERASE | ERASE | WRITE | ? |

SEMICONDUCTOR DEVICE

CROSS-REFERENCE TO RELATED APPLICATION

The disclosure of Japanese Patent Application No. 2010-176993 filed on Aug. 6, 2010 including the specification, drawings and abstract is incorporated herein by reference in its entirety.

BACKGROUND

The present invention relates to a semiconductor device, and particularly to a semiconductor device comprising an electrically programmable nonvolatile memory.

There are methods of storing complementary data in a pair of two memory cells in order to improve the retention characteristic of an electrically programmable, nonvolatile memory such as a flash memory. For example, Patent literature 1 (Japanese Patent Laid-Open No. 2008-117510) discloses a semiconductor device including a memory array having a plurality of first memory elements and second memory elements as a one-bit twin cell. A read circuit which determines the memory state of the twin cell differentially amplifies complementary data being output from the first memory element and the second memory element of the selected twin cell.

SUMMARY

A nonvolatile memory such as a flash memory needs to perform a blank check of a region to which data is to be written without fail before writing data therein, because it is prohibited to write data into a region having another data already written therein. However, it has been necessary to set verification levels considering the variation in the characteristics of individual memory cells, because a conventional blank check determines whether or not each memory cell is in an erase state based on its absolute threshold voltage. Accordingly, the guaranteed retention period needs to be limited so that no erroneous determination is made in the blank check, although a complementary data method is used. Since it is predicted that the guaranteed retention period will be shorter along with the ongoing miniaturization of the semiconductor process, improvement of the retention period is an important issue.

The present invention has been made in view of the above circumstances and provides a semiconductor device comprising a nonvolatile memory capable of storing complementary data and performing a more accurate blank check than ever before.

A semiconductor device according to an embodiment of the present invention comprises a memory array, a selection circuit, and first to third determination units. The memory array has a plurality of memory cells provided therein each having a transistor with a variable threshold voltage. The memory cells included in the memory array is grouped into a plurality of twin cells each having two memory cells. With the threshold voltage of one memory cell being set higher than that of the other memory cell, each of the twin cells stores complementary data. The selection circuit selects a plurality of selected twin cells forming a part of the twin cells. The first determination unit determines, for each of the selected twin cells, whether or not a first condition that the threshold voltage of one memory cell is higher than a reference value commonly set for the selected twin cells and the threshold voltage of the other memory cell is lower than the reference value is satisfied. The second determination unit determines whether or not a second condition that all the selected twin cells satisfy the first condition is satisfied. The third determination unit determines, based on the determination result of the second determination unit, whether or not each of the selected twin cells is in a blank state in which no complementary data is stored.

According to the semiconductor device of the embodiment, providing the first to third determination units for the blank check determination allows for a more accurate blank check than ever before.

BRIEF DESCRIPTION OF THE DRAWINGS

FIG. 8 is a flow chart illustrating a procedure performed when a control logic unit 20 of FIG. 3 receives a blank check command;

FIGS. 10A to 10D are explanatory drawings illustrating the result of determination on verification levels LV1 to LV3 by the write state determination circuit 56 and the result of the final verification check in FIG. 9;

FIGS. 11A to 11D are explanatory drawings illustrating the determination result of a blank check performed similarly to the verification operation when erasing data, without using the write state determination circuit 56;

DETAILED DESCRIPTION

Figure 1:
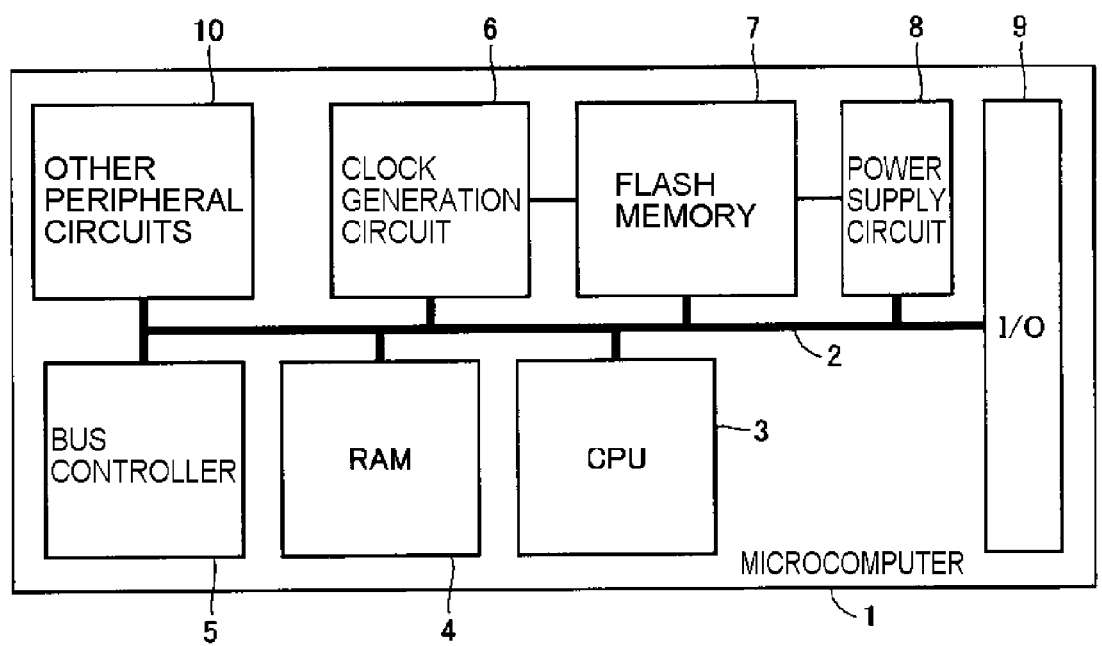
FIG. 1 is a block diagram schematically illustrating a configuration of a single chip microcomputer 1 which is an exemplary semiconductor device according to an embodiment 1 of the present invention.

Embodiments of the present invention will be described in detail below, referring to the drawings. Identical reference numerals are provided to identical or equivalent members, with duplicate description thereof being omitted.

Embodiment 1

Microcomputer

FIG. 1 is a block diagram schematically illustrating a configuration of a single chip microcomputer 1 which is an exemplary semiconductor device according to an embodiment 1 of the present invention. The microcomputer 1 of FIG. 1 is formed over a single semiconductor substrate (chip) such as single crystal silicon, for example, using a well-known semiconductor integrated circuit manufacturing technology.

The microcomputer 1 includes, as a circuit module coupled to an internal bus 2, a CPU (Central Processing Unit) 3, a RAM (Random Access Memory) 4, a bus controller 5, a clock generation circuit 6, a flash memory 7 as an example of an electrically programmable nonvolatile semiconductor memory device, a power supply circuit 8, an input/output port (I/O) 9, and other peripheral circuit 10 such as a timer counter or the like.

The internal bus 2 includes an address bus, a data bus, and a control bus. The CPU 3 controls the inside of the microcomputer 1 according to a program. The RAM 4 is used as a work area of the CPU 3. The bus controller 5 controls communication between the CPU 3 and other devices via the address bus and the data bus. The clock generation circuit 6 generates an operation reference clock signal as well as other internal clock signals. The flash memory 7 stores operation programs or data of the CPU 3. The power supply circuit 8 generates power supply voltage used in the microcomputer 1.

With the microcomputer 1 installed in the system, the CPU 3 issues erase and write commands to the flash memory 7. At the device test or manufacturing phase, an external writing device (not shown) can directly control erasing and writing of the flash memory 7 via the I/O port 9.

[Configuration of Nonvolatile Memory Cell]

Figure 2A:
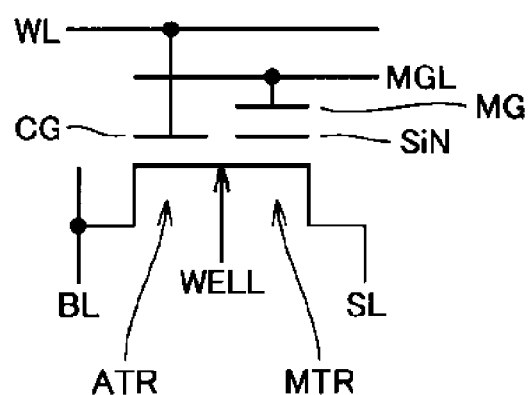
FIGS. 2A and 2B schematically illustrate a representative configuration of a memory cell for a flash memory.
Figure 2B:
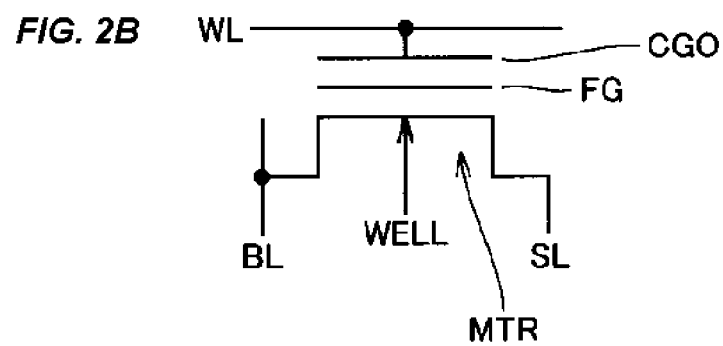

FIGS. 2A and 2B are schematic views each illustrating a representative configuration of a memory cell for flash memory. FIG. 2A shows a split gate type memory cell and FIG. 2B shows a stacked gate type memory cell. The flash memory 7 of this embodiment uses a split gate type memory cell shown in FIG. 2A.

The memory cell shown in FIG. 2A includes a first impurity region coupled to a bit line BL, a second impurity region coupled to a source line SL, a channel region between the first and second impurity regions, a control gate CG, a memory gate MG, and a silicon nitride layer SiN as an electric charge accumulation unit. The control gate CG and the memory gate MG are formed on the channel region via a gate insulating film and coupled to a word line WL and a memory gate line MGL, respectively. The silicon nitride layer SiN, which is formed within a gate insulating film between the memory gate MG and the channel region, has many trap levels. The type having a silicon nitride layer as shown in FIG. 2A is referred to as a MONOS (Metal Oxide Nitride Oxide Silicon) type. It is also possible to configure a split gate type memory cell by using, as the electric charge accumulation unit, a floating gate formed by polycrystalline silicon in place of the silicon nitride layer.

The memory cell in FIG. 2A may be considered to have a structure in which an access transistor ATR and a memory transistor MTR are coupled in series. The threshold voltage of the access transistor ATR is constant (positive threshold for the N channel). On the other hand, the threshold voltage of the memory transistor MTR varies according to the charge amount trapped in the silicon nitride layer SiN. If the channel region is an N (negative) channel, the threshold voltage of the memory transistor MTR rises upon injection of electrons into the silicon nitride layer SiN, whereas the threshold voltage of the memory transistor MTR drops upon extraction of electrons from the silicon nitride layer SiN (or injection of positive holes therein). The state in which the threshold voltage is relatively low (usually a negative threshold voltage) corresponds to the cell data being "1" (erase state), whereas the state in which the threshold voltage is relatively high (usually a positive threshold voltage) corresponds to the cell data being "0" (write state or program state).

In order to raise the threshold voltage of the memory transistor MTR, settings are performed such that the bit line BL=0V, the control gate CG=1.5V, the memory gate MG=10V, source line SL=6V, and the well region WELL (semiconductor substrate)=0V, for example. Accordingly, a so-called source side injection (SSI) occurs, whereby hot electrons generated in the channel region near the border between the control gate CG and the memory gate MG are injected into the silicon nitride layer SiN. In order to provide a desired threshold voltage, a pulse voltage set to the above setting voltage (referred to as write pulse in the following) is applied to the memory gate MG and the source line SL for a plurality of times.

In order to lower the threshold voltage of the memory transistor MTR, settings are performed such that the bit line BL=Hi-Z (high impedance state), the control gate CG=1.5V, the memory gate MG=−10V, source line SL=6V, and the well region WELL (a semiconductor substrate)=0V, for example. Accordingly, the region between the channel region and the second impurity region coupled to the source line SL turns into a reverse bias state, causing hot hall to be injected into the silicon nitride layer SiN by Band-To-Band Tunneling (BTBT). In order to provide a desired threshold voltage a pulse voltage (referred to as erase pulse in the following) set to the above setting voltage is applied to the memory gate MG and the source line SL for multiple times.

When reading data, settings are provided such that the bit line BL=1.5V, the control gate CG=1.5V, the memory gate MG=0V, the source line SL=0V, and the well region WELL (semiconductor substrate)=0V, for example. Setting the control gate CG to 1.5V makes the access transistor ATR conductive, whereas the memory transistor MTR becomes conductive if the cell data is "1" and nonconductive if the cell data is "0".

There may be a case that a read error occurs because leaving the memory transistor MTR for a long time causes its threshold voltage to gradually vary. In the flash memory 7 of the embodiment 1, a twin cell is formed for each pair of two memory cells as will be described below, and thus the retention characteristic is improved because each twin cell stores complementary data.

The structure of the memory cell used for the flash memory 7 may be different for that of this embodiment, or may be a stacked gate type shown in FIG. 2B. The memory cell of FIG. 2B includes a first impurity region coupled to the bit line BL, a second impurity region coupled to the source line SL, a channel region between the first and second impurity regions, a floating gate FG stacked on the channel region via an insulating layer, and a control gate CG0 stacked on the floating gate FG via an insulating layer. For an N channel, injection of electrons into the floating gate FG acting as the electric charge accumulation layer raises the threshold voltage of the transistor MTR, whereas extraction of electrons from the floating gate FG lowers the threshold voltage. A silicon nitride layer SiN may be used as the electric charge accumulation layer in place of the floating gate FG. The stacked gate type memory cell can be regarded as a configuration without the access transistor ATR provided in the split gate type memory cell.

[Overall Configuration of Flash Memory]

Figure 3:
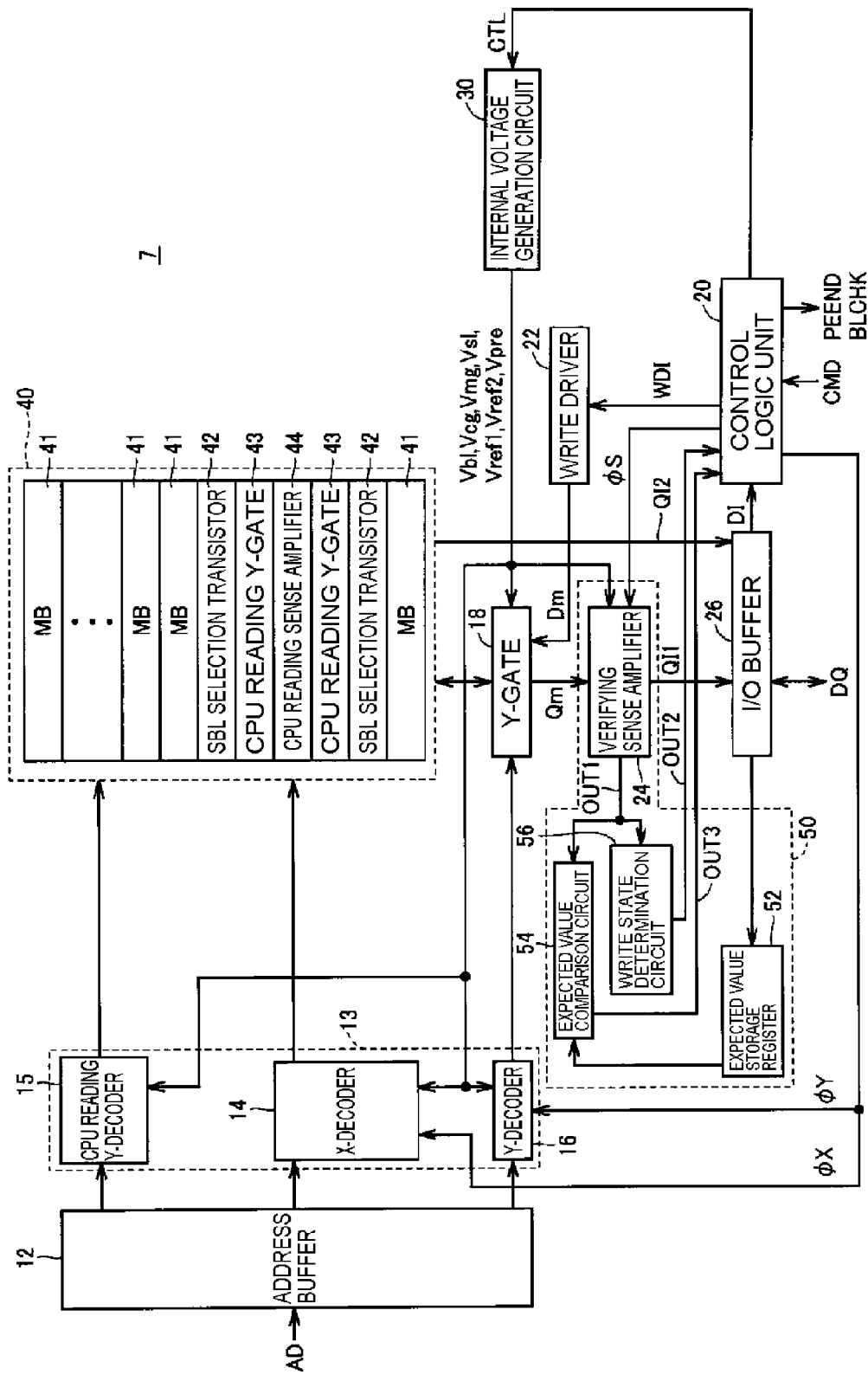
FIG. 3 is a block diagram schematically illustrating the overall configuration of a flash memory 7 of FIG. 1.

FIG. 3 is a block diagram schematically illustrating the overall configuration of the flash memory 7 of FIG. 1.

Referring to FIG. 3, the flash memory 7 includes a memory mat 40, an address buffer 12, an X-decoder 14, a Y-decoder 16, a CPU reading Y-decoder 15, a Y-gate 18, a control logic unit 20, a write driver 22, an I/O buffer 26, and an internal voltage generation circuit 30. A selection circuit 13 comprises the X-decoder 14, the Y-decoder 16, and the CPU reading Y-decoder 15.

The memory mat 40 includes a plurality of memory blocks (MB) 41, a plurality of sub-bit line selection units 42 (sub-bit line (SBL) selection transistors), a plurality of CPU reading Y-gates 43, and a plurality of CPU-reading sense amplifier units 44. Each of the sense amplifier units 44, provided for every two memory blocks 41, is located in a region between two corresponding memory blocks 41. The sub-bit line selection units 42 and the CPU reading Y-gates 43 are provided between the sense amplifier units 44 and their corresponding memory blocks 41.

Figure 4:
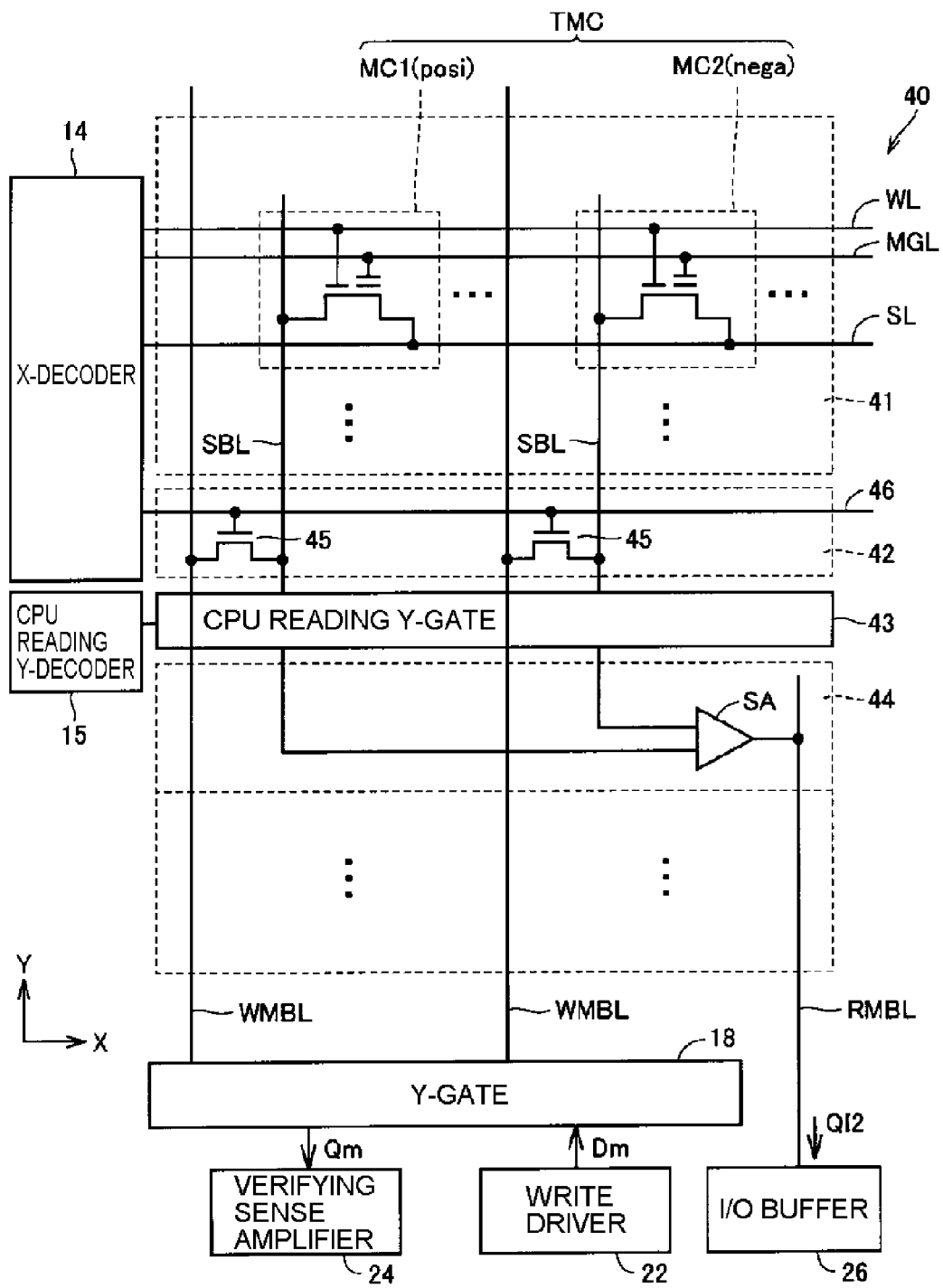
FIG. 4 schematically illustrates the internal configuration of a memory block 41, a sub-bit line selection unit 42, and a sense amplifier unit 44 of FIG. 3.

FIG. 4 illustrates the internal configuration of a memory block 41, a sub-bit line selection unit 42, and a sense amplifier unit 44 of FIG. 3.

Referring to FIGS. 3 and 4, a plurality of memory cells are arranged in each of the memory blocks 41 in a matrix manner (the rows and columns located along the X- and Y-axes, respectively, as shown in FIG. 4.) The bit line BL is layered into a main bit line WMBL and a sub-bit line SBL. The word line WL, the memory gate line MGL, and the source line SL are provided in association with each row of the memory blocks 41, and the sub-bit line SBL is provided in association with each column of the memory blocks 41. The sub-bit line SBL is coupled to the common main bit line WMBL extending along the column direction Y via a sub-bit line selection transistor 45 provided in the sub-bit line selection units 42. A gate of the sub-bit line selection transistor 45 is coupled to the X-decoder 14 via the signal line 46. The X-decoder 14 activates the sub-bit line selection transistor 45 at the time of writing, erasing, and blank checking.

The memory cells included in each of the memory blocks 41 are grouped into a twin cell TMC including two memory cells MC1 and MC2. The first memory cell MC1 composing each twin cell is referred to as a positive side memory cell and the second memory cell MC2 is referred to as a negative side memory cell. Each of the twin cell stores complementary data. If the twin cell data is "1", the positive side memory cell MC1 takes the cell data "1" (low threshold voltage state for the N channel) and the negative side memory cell MC2 takes the cell data 0" (high threshold voltage state). If the twin cell data is "0", the positive side memory cell MC1 takes the cell data 0" (high threshold voltage state for the N channel) and the negative side memory cell MC2 takes the cell data "1" (low threshold voltage state). For the blank state where the twin cell has no complementary data stored therein, the cell data of the positive and negative memory cells MC1 and MC2 becomes "1" (low threshold voltage state for the N channel). The memory cells MC1 and MC2 composing each twin cell are usually arranged on the same row and coupled to the same word line WL and the same memory gate line MGL.

When writing data into the twin cells, it is configured so that the write current flows only to the positive or the negative side memory cell depending on the complementary data to be stored. For example, when storing the twin cell data "0", a bit line of the positive side memory cell is set to 0V (a value lower than the setting voltage 1.5V of the control gate CG) and a bit line of the negative side memory cell is set to 1.5V (a value equal to the setting voltage 1.5V of the control gate CG). The memory gate voltage and the source line voltage are equal at both the positive side and the negative side. As a result, the cell data of the positive side memory cell becomes "0" (high threshold state for the N channel) and the cell data of the negative side memory cell becomes "1" (low threshold voltage state). A verification operation is performed after a write pulse has been applied. During the verification operation, a verifying sense amplifier is used to check whether or not the threshold voltage of the memory cell having the write pulse applied thereto is a predetermined value or more.

Erasing data of the twin cells is performed according to the same procedure as the ordinary case which is different from the complementary data method. An erase pulse is applied for a predetermined number of times to the memory cells to be erased. A verification operation is performed after the erase pulse has been applied. During the verification operation, a verifying sense amplifier is used to check whether or not the threshold voltage of the memory cell to be erased has dropped to a predetermined value.

The CPU-reading sense amplifier unit 44 reads the stored data of the twin cell (referred to as a selected twin cell is) selected by the X-decoder 14 and the Y-decoder 16. The CPU-reading sense amplifier unit 44 includes a plurality of sense amplifiers SA (a single sense amplifier SA is representatively illustrated in FIG. 4). A differential input terminal of each sense amplifier SA is coupled to the memory cells MC1 and MC2 at the positive side and the negative side composing the selected twin cell via the CPU reading Y-gate 43. The CPU reading Y-gate 43 couples two sub-bit lines SBL corresponding to the selected twin cell and a differential input terminal of the sense amplifier SA, according to a selection signal of the CPU reading Y-decoder 15. The output terminal of the sense amplifier SA is coupled to the I/O buffer 26 via the read-out main bit line RMBL. When the same voltage is applied to the control gate CG and the memory gate MG of the memory cells MC1 and MC2 forming a pair (e.g., CG=1.5V and MG=0V), the sense amplifier SA amplifies the difference of currents flowing in the memory cells MC1 and MC2. The sense amplifier SA, also referred to as a high-speed sense amplifier, is optimized for high-speed read operation. Because the sense amplifier SA detects the relative current difference between the memory cells MC1 and MC2 composing the twin cell, it can accurately read data even if the threshold voltage of each memory cell varies over time.

The address buffer 12 receives an address signal AD from an external CPU 3 or the like when accessing a memory cell (when reading data, erasing data, writing data, and performing the verification operation) and generates an internal address. The X-decoder 14 provides a predetermined voltage to the word line WL, the memory gate line MGL, and the source line SL according to the internal address and activates the sub-bit line selection transistor 45. The Y-decoder 16 generates a column selection signal according to the internal address and controls the Y-gate 18 by the generated column selection signal. Accordingly, a memory cell addressed by the address signal AD is selected from the memory mat 40.

According to control signals φX and φY from a control logic unit 20, the X-decoder 14 and the Y-decoder 16 provide a predetermined voltage to the word line WL, the memory gate line MGL and the source line SL, activate the sub-bit line selection transistor 45, and control the Y-gate 18 according to the column selection signal. A plurality of memory cells to be blank checked are selected from the memory mat 40 thereby.

The Y-gate 18 is coupled to the main bit line WMBL. The Y-gate 18 sets the main bit line WMBL of the selected column to a voltage lower (e.g., 0V) than the control gate voltage or a voltage equal (e.g., 1.5V) to the control gate voltage, according to the cell write data Dm from the write driver 22 when writing data. The cell data "0" corresponds to 0V and the cell data "1" corresponds to 1.5V. The Y-gate 18 sets the main bit line WMBL of the selected column to a high impedance state according to the column selection signal from the Y-decoder 16 when erasing data. The Y-gate 18 outputs a signal Qm of the main bit line WMBL to the verifying sense amplifier unit 24, described below, according to the column selection signal from the Y-decoder 16 when performing a verification operation and a blank check.

The control logic unit 20, comprising a sequence controller for example, receives respective commands CMD such as a write command, a read command, an erase command, and a blank check command from the CPU 3 or the like, and outputs an internal control signal required to perform the respective commands CMD.

The write driver 22 generates cell write data Dm for the memory cell according to internal write data WDI from the control logic unit 20. The cell write data Dm from the write driver 22 is output to the Y-gate 18.

When reading data, the I/O buffer 26 generates read data DQ according to internal read data QI2 that has been output from the CPU-reading sense amplifier unit 44 and outputs it to the CPU 3 of FIG. 1. When writing data, the I/O buffer 26 generates internal write data DI according to write data DQ received from the CPU 32 and outputs it to the control logic unit 20. When performing verification, the I/O buffer 26 generates read data DQ according to internal read data QI1 that has been output from the verifying sense amplifier unit 24 and outputs it to the CPU 3 of FIG. 1.

According to a control signal CTL supplied from the control logic unit 20, the internal voltage generation circuit 30 generates an internal voltage, based on a power supply voltage VDD supplied from the power supply circuit 8 of FIG. 1 and a ground voltage. The internal voltage includes a bit line voltage Vbl transmitted to the main bit line WMBL, a control gate voltage Vcg transmitted to the word line WL, a memory gate voltage Vmg transmitted to the memory gate line MGL, a source line voltage Vsl transmitted to the source line SL, reference voltages Vref1 and Vref2 transmitted to the verifying sense amplifier unit 24, and a pre-charge voltage Vpre.

The flash memory 7 further includes the verifying sense amplifier unit 24, an expected value storage register 52, an expected value comparison circuit 54, and a write state determination circuit 56. The circuit 50 thereof is used when performing a verification operation and a blank check. A verification operation verifies the data write state and the data erase state when writing data and erasing data. A blank check refers to checking whether or not the memory array is in the erase state before writing data.

[Problems with Conventional Blank Check]

With a general flash memory, it is prohibited, as well as the case of writing complementary data, to write data into a region where another data has already been written. This is because the threshold voltage of a memory cell can only be varied in the writing direction (rising direction for the N channel) when performing a write operation. For example, writing the cell data of "55h" into a region where the cell data of "AAh" (h expresses a hexadecimal) has been written, the cell data becomes "00h" and not "55h". In order to avoid such an inconvenience, a blank check of the region to which data is to be written is always performed before writing the data therein. A conventional blank check determines whether or not the threshold voltage of each memory cell is lower than a predetermined value using a verifying sense amplifier, as with the case of verification after erasing.

It must be noted that a blank check cannot be performed using the CPU-reading sense amplifier unit 44 when complementary data is used. The CPU-reading sense amplifier unit 44 detects the relative current difference due to the difference between the threshold voltages of the positive side and the negative side memory cells. Accordingly, it is impossible to distinguish whether the result of the detection by the sense amplifier units 44 is due to random difference between the threshold voltages of the memory cells in the erase state, or due to writing of complementary data. Therefore, it is necessary to determine whether or not the memory cells are in the erase state based on the absolute threshold voltage of each memory cell when performing a blank check, whereas it suffices to detect the relative difference between the threshold voltages of the positive side and the negative side memory cells when reading complementary data.

A problem arises here in that leaving a memory cell for a long time after writing or erasing causes shifting of the threshold voltage of the memory cell. The reason for the threshold voltage shift is that the threshold voltage of the memory cell tends to approach the threshold voltage at a state where no electric charge is held in the silicon nitride layer (referred to as an initial state in the following). The threshold voltage at the initial state depends on the process variation, and the amount of change of the threshold voltage immediately after writing or erasing depends on the temperature or the voltage applied to the memory cell. Even if the threshold voltage shifts to a certain extent, it is possible to read data with the sense amplifier by using data storage which employs complementary data. However, because it is necessary in a blank check to determine whether or not a memory cell is in the erase state based on the absolute threshold voltage of each memory cell, a shift of the threshold voltage may lead to an erroneous determination. In other words, the guaranteed retention period had to be limited so that no erroneous determination occurs in the blank check, although the complementary data method has been conventionally used.

The flash memory 7 of this embodiment has provided therein a write state determination circuit 56 as a dedicated circuit for the blank check. Use of this circuit realizes accurate determination for cases where erroneous blank check determination may be performed by the conventional blank check method, allowing a longer guaranteed retention period than ever before. Detailed description will be given below.

[Details of Verification Operation and Blank Check]

Figure 5:
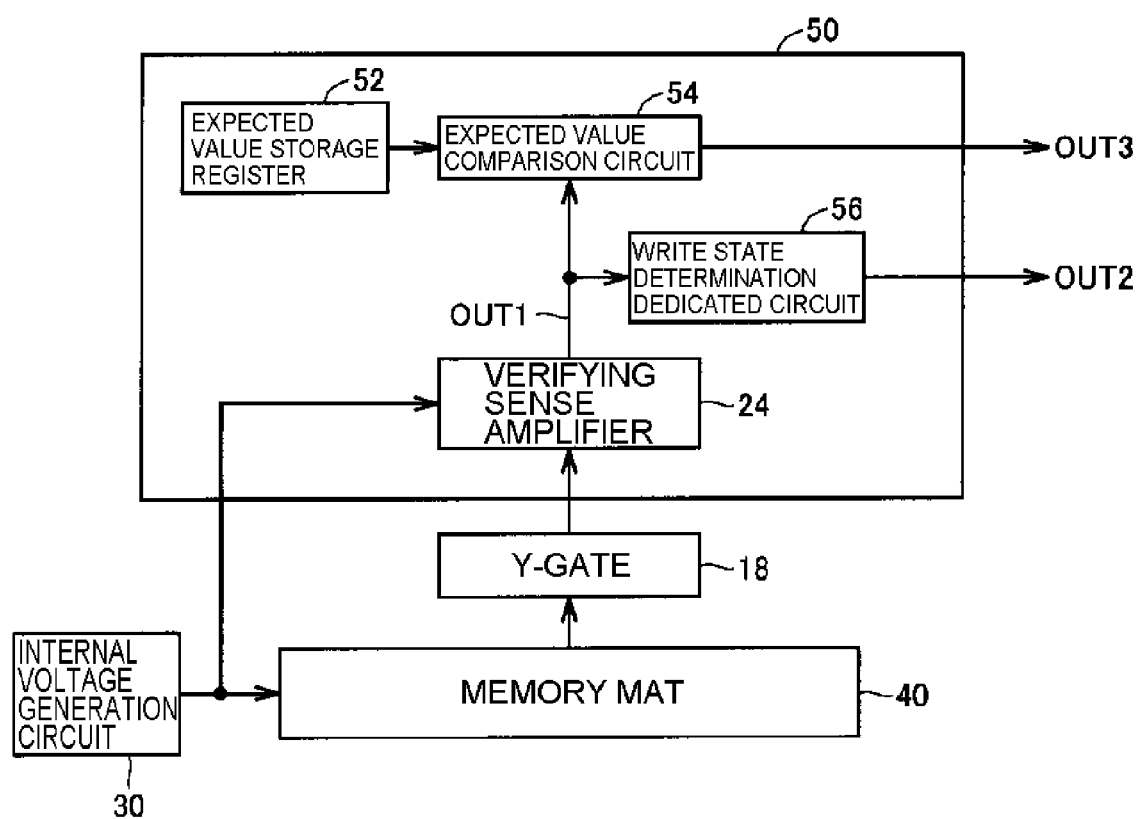
FIG. 5 focuses on a circuit portion 50 in the flash memory 7 of FIG. 3 for performing a verification operation and a blank check.

FIG. 5 focuses on a circuit portion 50 in the flash memory 7 of FIG. 3 for performing a verification operation and a blank check. FIG. 5 also illustrates the memory mat 40, the Y-gate 18, and the internal voltage generation circuit 30. Referring to FIGS. 3 and 5, the verifying sense amplifier unit 24 compares a read current that flows in the memory cell when a predetermined voltage is applied to the control gate CG and the memory gate MG with a predetermined reference current and outputs a comparison result OUT1.

Figure 6:
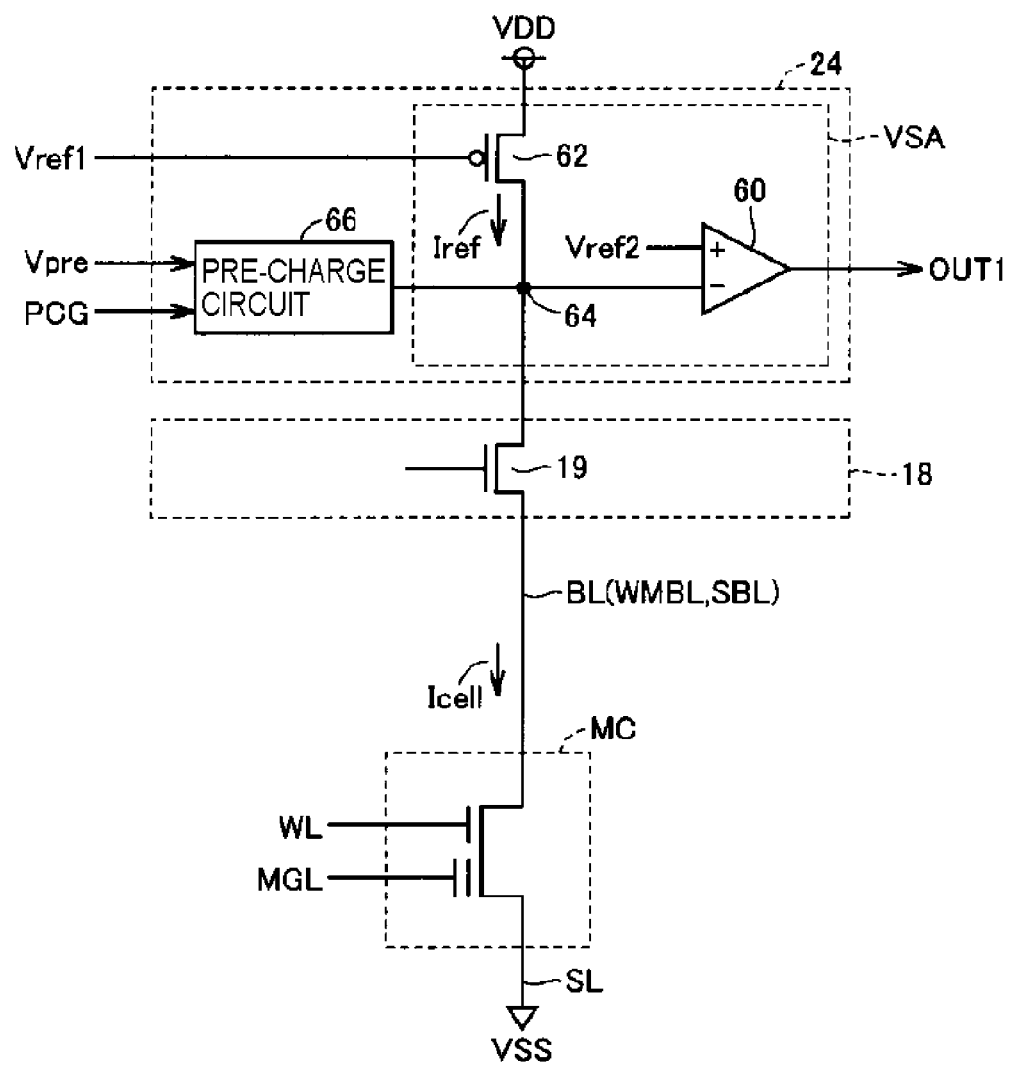
FIG. 6 is a circuit diagram schematically illustrating a configuration of a verifying sense amplifier unit 24 of FIG. 5.

FIG. 6 is a circuit diagram schematically illustrating a configuration of a verifying sense amplifier unit 24 of FIG. 5. FIG. 6 also illustrates the configuration of the Y-gate 18 and the memory cell MC coupled via the Y-gate 18. Referring to FIG. 6, the verifying sense amplifier unit 24 includes a plurality (128 in this embodiment) of sense amplifiers VSA and pre-charge circuits 66.

Each of the sense amplifiers VSA includes a current source PMOS (Positive-channel Metal Oxide Semiconductor) transistor 62 provided between a power supply node supplying the power supply voltage VDD and a coupling node 64, and a comparison circuit 60 which compares the voltage of the coupling node 64 with a reference voltage Vref2. The reference voltage Vref1 is applied to the gate of the PMOS transistor 62. The reference voltages Vref1 and Vref2 are supplied from the internal voltage generation circuit 30 shown in FIGS. 3 and 5. The comparison circuit 60 outputs a low (L) level (data "0") signal when the voltage of the coupling node 64 exceeds the reference voltage Vref2.

The bit lines BL (WMBL and SBL) of the memory cell MC to be verified is coupled to the coupling node 64 via a column selection transistor 19 provided in the Y-gate 18. The source line of the memory cell MC is coupled to a power supply node VSS which provides the ground voltage. When a control signal PCG that has been output from the control logic unit 20 of FIG. 3 is activated, the pre-charge circuit 66 outputs the pre-charge voltage Vpre generated in the internal voltage generation circuit 30 to the coupling node 64. In the case of the embodiment 1, the pre-charge voltage Vpre is set to a higher value than the reference voltage Vref2.

The voltage of the coupling node 64 is determined according to the magnitude relataion of the reference current Iref flowing in the PMOS transistor 62 and the read current Icell flowing in the memory cell MC. For example, if the cell data stored in the memory cell MC is "1" (low threshold voltage state), the read current Icell becomes larger than the reference current Iref and thus the voltage of the coupling node 64 becomes smaller than the reference voltage Vref2. As a result, the output of the comparison circuit 60 rises to "H" (data 1). If the cell data stored in the memory cell MC is "0" (high threshold voltage state), the read current Icell becomes smaller (almost 0) than the reference current Iref and thus the voltage of the coupling node 64 becomes larger than the reference voltage Vref2. As a result, the output of the comparison circuit 60 drops to "L" (data 0).

Although the output result from the verifying sense amplifier VSA depends on the reference voltages Vref1 and Vref2, and the gate voltages Vcg and Vmg, the value is common to all the sense amplifiers VSA. In other words, the reference value (referred to as a verification level) to be compared with the threshold voltage of these memory cells is set to a common value when performing verification of the memory cells.

Referring to FIGS. 3 and 5 again, the expected value storage register 52 and the expected value comparison circuit 54 are used for verification immediately after writing data and immediately after erasing data. The expected value storage register 52 stores the write data DI as an expected value when writing data, and stores data "1" for each memory cell to be erased as an expected value when erasing data. The expectation comparison circuit 54 compares the output OUT1 of the verifying sense amplifier unit 24 with the expected value stored in the expected value storage register 52 when performing a verification operation after writing data and after erasing data, and outputs the comparison result OUT3 to the control logic unit 20. The control logic unit 20 receives the comparison result OUT3 and, if the output OUT1 of the verifying sense amplifier unit 24 matches the expected value, outputs an end-of-write-and-erase signal PEENND to the external CPU 3 or the like. If the output OUT1 of the verifying sense amplifier unit 24 does not match the write data DI, the control logic unit 20 controls to apply an additional write pulse or an erase pulse to the memory cell designated by the X-decoder 14 and the Y-decoder 16.

The write state determination circuit 56 is dedicated for the blank check. The write state determination circuit 56 receives the determination result OUT1 by the verifying sense amplifier unit 24 for a plurality of twin cells (referred to as selected twin cells) designated by the control logic unit 20. The write state determination circuit 56 determines whether or not the selected twin cells are in a blank state based on the determination result OUT1 and outputs a determination result OUT2 to the control logic unit 20.

Figure 7:
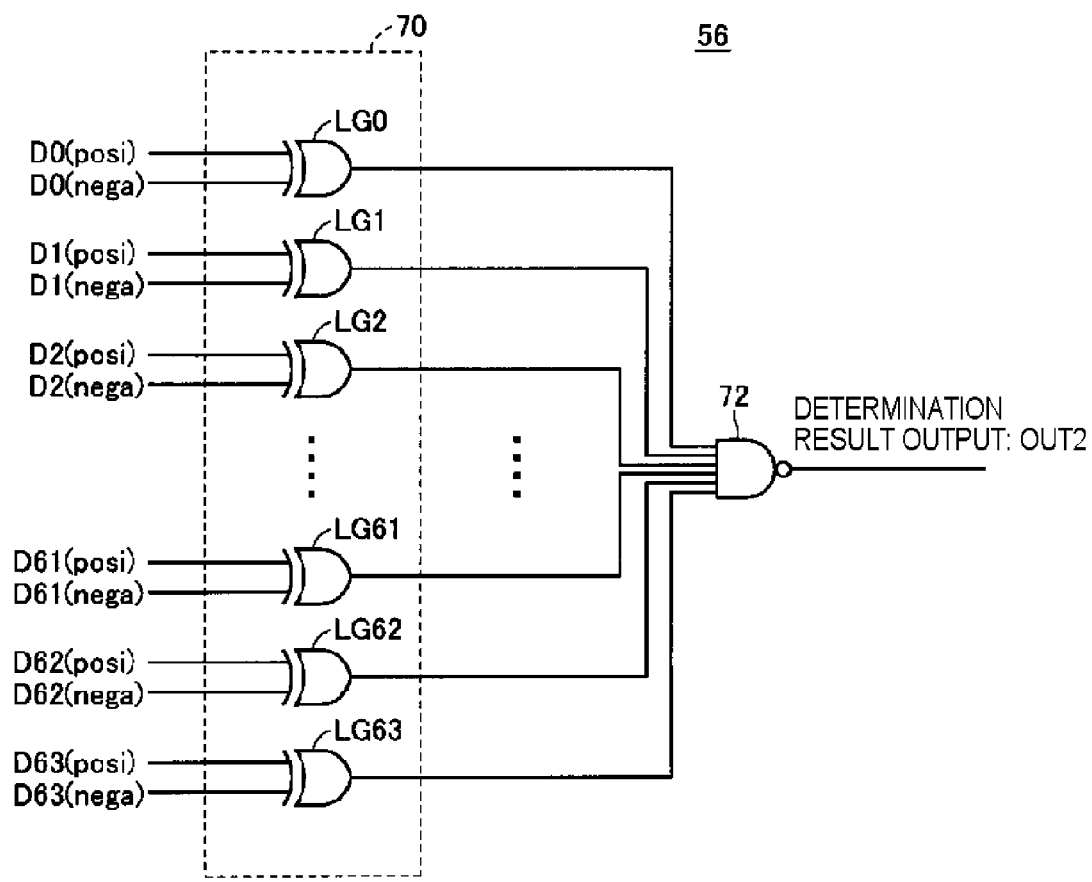
FIG. 7 is a circuit diagram illustrating a specific example of the configuration of a write state determination circuit 56 shown in FIGS. 3 and 5.

FIG. 7 is a circuit diagram illustrating a specific example of the configuration of a write state determination circuit 56 shown in FIGS. 3 and 5. The write state determination circuit 56 performs the blank check on units of a plurality of twin cells and not on an individual one. In the case of FIG. 7, an exemplary configuration of a circuit which performs the blank check on 128 memory cells (64 pairs of selected twin cells) is shown. In the case of the flash memory of the embodiment 1, 64 pairs of selected twin cells to be blank checked are units to which data are simultaneously written. In FIG. 7, D0 (positive), D0 (negative)-D63 (positive) and D63 (negative) indicate the output data of the verifying sense amplifier (reference numeral VSA in FIG. 6) for the memory cells at the positive side and the negative side of the 64 pairs of selected twin cells.

The write state determination circuit 56 includes exclusive OR circuits LG0 to LG63 (first determination unit 70) provided respectively in association with the 64 pairs of selected twin cells, and an NAND circuit 72 (second determination unit). Each exclusive OR circuit obtains the exclusive OR between the output data of the verifying sense amplifier to the memory cell at the positive side of the corresponding twin cell and the output data of the verifying sense amplifier for the memory cell at the negative side. The NAND circuit 72 outputs the inverted logical AND of the outputs of the exclusive OR circuits LG0 to LG63. The output OUT2 of the NAND circuit 72 becomes "0" (not in the blank state) if the verification result of either one of the memory cells at the positive side or the negative side is "1" for all the 64 sets of twin cells (low threshold voltage state) and the verification result of the other memory cell is "0" (high threshold voltage state). The output OUT2 of the NAND circuit 72 becomes "1" (blank state) if the verification result of both memory cells at the positive side and the negative side is "1" or "0" for at least one twin cell.

Next, the relation between the write state of the memory cell and the determination result of the write state determination circuit 56 will be described. It is assumed in the following description that each memory cell is the N channel.

(i) When the 64 pairs of selected twin cells to be blank checked are in the erase state In this case, since the memory cells at the positive side and the negative side are in the low threshold voltage state for any of the twin cells, the output OUT2 of the write state determination circuit 56 is basically "1" and thus it is determined to be in the blank state. Although the output of the exclusive OR circuit corresponding to a part of the twin cells may become "1" if the threshold voltage of each memory cell has shifted because it has been left for a long time after erasing data, the probability that the output OUT2 of the write state determination circuit 56 becomes "0" (write state) is very low as long as the number of twin cells to be blank checked (equal to the unit of writing unit for this embodiment) is appropriate. Erroneous determination by the write state determination circuit 56 such that a memory array in the erase state is in the write state most likely occurs when the verification level is equal to the mean of the distribution of the threshold voltage of the memory cells in the semiconductor chip. Even in such a case, however, the probability of erroneously determining to be in the write state is the 64th power of 0.5, which is near zero, when the number of twin cells to be blank checked is 64.

(ii) When the selected twin cells to be blank checked are in the write state

In this case, since one of the memory cells at the positive side and the negative side is in the high threshold voltage state and the other is in the low threshold voltage state for any of the twin cell, the output OUT2 of the write state determination circuit 56 is basically "0" and thus it is determined to be in the write state. If the threshold voltage of each memory cell has shifted by leaving it for a long time after writing data, the output of the exclusive OR circuit corresponding to a part of the twin cells may become "0". As a result, the output OUT2 of the write state determination circuit 56 becomes "1" although it is in the write state, and the write state determination circuit 56 circuits may determine that it is not in the write state. In the flash memory of the embodiment 1, therefore, the verification level of the sense amplifier VSA is varied within a predetermined range and, if the output OUT2 of the write state determination circuit 56 becomes "0" for at least one verification level, the flash memory is determined to be in the write state.

(iii) When the threshold voltage of the selected twin cells to be blank checked is high at both the positive side and the negative side, the output of each exclusive OR circuit becomes "0" and the output OUT2 of the write state determination circuit 56 becomes "1", and thus it is determined not to be in the write state. In this case, therefore, there is a possibility of additional writing. However, the probability that the threshold voltages of the memory cells at the positive side and the negative side are both high is low because it occurs only when an irregular control is performed such as the case where power supply is forcibly shut down during a rewrite operation of the flash memory.

In view of the above discussion, the control logic unit 20 of FIG. 3 performs the blank check according to the following procedure, upon receiving a blank check command from the CPU 3 of FIG. 1.

FIG. 8 is a flow chart illustrating a procedure performed when a control logic unit 20 (a third determination unit) of FIG. 3 receives a blank check command.

Referring to FIGS. 3 and 8, the control logic unit 20 first performs a setup operation upon receiving the blank check command from the CPU 3 of FIG. 1 at step S1. The setup operation activates the internal voltage generation circuit 30 which generates the internal voltage to be output to the memory mat 40 and the verifying sense amplifier unit 24 when performing the blank check. The control logic unit 20 further initializes the number of verification times to 0, and initializes the voltage Vmg which will be applied to the memory gate MG of the memory cell to be blank checked.

At step S2, the control logic unit 20 establishes the address for performing the blank check and outputs, to the X-decoder 14 and the Y-decoder 16, control signals $\phi X$ and $\phi Y$ specifying the twin cells to be blank checked.

At step S3, the verifying sense amplifier unit 24 performs verification of the memory cell to be blank checked. The determination result OUT2 of the write state determination circuit 56 is established, according to the output result OUT1 of the verifying sense amplifier.

At step S4, the control logic unit 20 determines whether or not the output OUT2 of the write state determination circuit 56 is "1" (blank state). If the determination result of the write state determination circuit 56 is "0" (No at step S4), the control logic unit 20 determines (step S5) that the selected twin cells are in the write state (determination result is NG), and outputs the determination result BLCHK to the CPU 3 of FIG. 1. Subsequently, the internal voltage generation circuit 30 is shut down (step S9), and the blank check is completed.

If the output OUT2 of the write state determination circuit 56 is "1" (YES at step S4), the control logic unit 20 determines that the selected twin cells are not in the write state and advances the process flow to step S6.

At step S6, the control logic unit 20 determines whether or not the number of verification times has reached a predetermined number of times for termination. If the number of verification times has reached the predetermined number of times for termination (YES at step S6), the control logic unit 20 determines (step S8) that the memory array is in the blank state (determination result is OK), and outputs the determination result BLKCHK to the CPU 3. Subsequently, the internal voltage generation circuit 30 is shut down (step S9), and the blank check is completed.

If the number of verification times has not reached the predetermined number of times for termination (NO at step S6), the control logic unit 20 advances the process flow to step S7. At step S7, the control logic unit 20 varies the voltage Vmg being applied to the memory gate MG of the memory cell to be blank checked. Subsequently, the processes after step S3 are performed again.

Figure 9A:
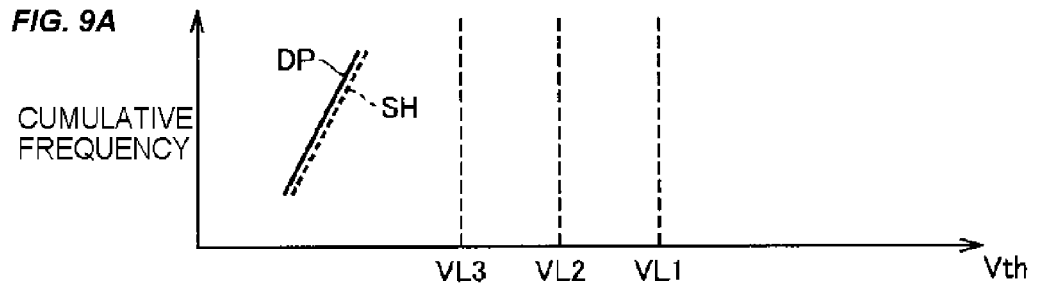
FIGS. 9a to 9D are graphs schematically illustrating the threshold voltage distribution of a memory cell in a semiconductor chip.
Figure 9B:
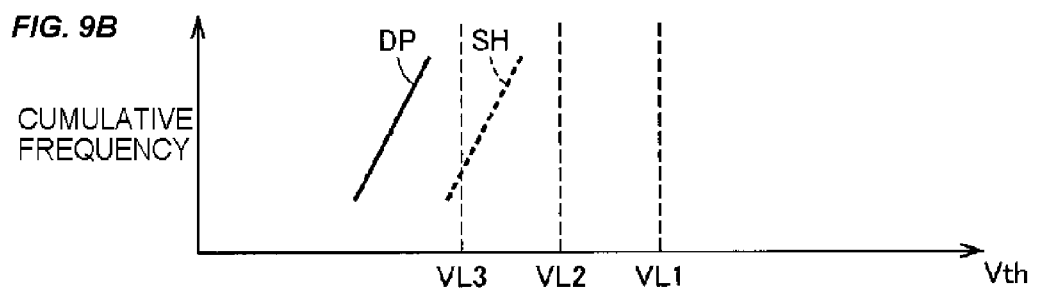
Figure 9C:
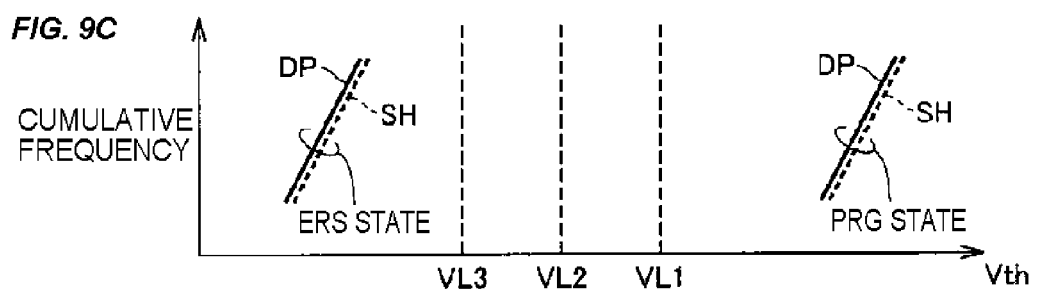
Figure 9D:
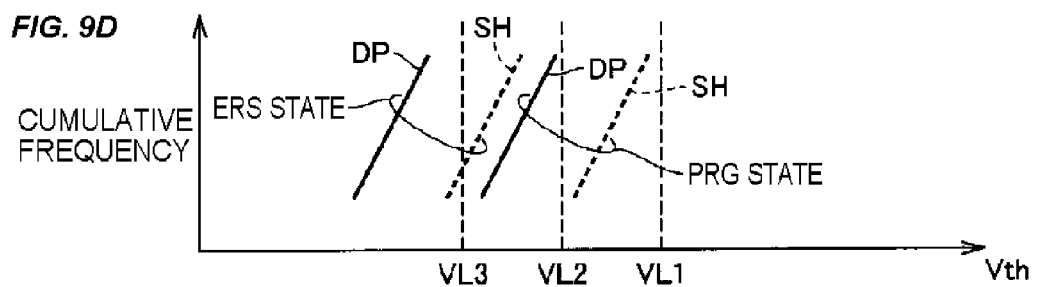

Effects of the above blank check procedure will be described below. FIG. 9 is a graph schematically illustrating the threshold voltage distribution of a memory cell in a semiconductor chip. FIG. 9A illustrates the distribution of the threshold voltage immediately after erasing data, and FIG. 9B illustrates the distribution of the threshold voltage which has shifted by being left from the state of FIG. 9A for a long time. FIG. 9C illustrates the distribution of the threshold voltage immediately after writing data and FIG. 9D illustrates the distribution of the threshold voltage which has shifted by being left from the state of FIG. 9C for a long time. In FIGS. 9A to 9D, the horizontal axis indicates the threshold voltage and the vertical axis indicates the cumulative frequency. Note that the scale of the vertical axis is normalized so that the cumulative frequency is expressed by a straight line. In FIGS. 9C and 9D, the threshold voltage distribution denoted as a PRG state is the threshold voltage distribution of the memory cells to which a write pulse is applied when writing data, whereas the threshold voltage distribution denoted as an ERS state is the threshold voltage distribution of the memory cells to which a write pulse is not applied and which are in the erase state when writing data. Since data is written in the positive side or the negative side in the twin cell method, the number of memory cells in the PRG state is equal to that of the memory cells in the ERS state.

The reason why leaving the memory cell for a long time results in the threshold voltage shift is that the threshold voltage of the memory cell tends to approach the threshold voltage at a state where no electric charge is held in the silicon nitride layer (initial state). The threshold voltage at the initial state depends on the process variation and thus there are a case where the threshold voltage at the initial state is high (referred to as the threshold voltage being shallow), and a case where the threshold voltage at the initial state is low (referred to as the threshold voltage being deep). In FIGS. 9A to 9D, the distribution for the shallow threshold voltage is shown by the dashed lines (reference numeral SH), whereas the distribution for the deep threshold voltage is shown by the solid lines (reference numeral DP). With the threshold voltage distribution after being left for a long time, the threshold voltage is relatively low if the threshold voltage is deep and the threshold voltage is relatively high if the threshold voltage is shallow.

The reference numerals VL1 to VL3 of FIG. 9 indicate the reference values (verification levels) to be compared with the threshold voltage of the memory cell when performing a verification operation in the verifying sense amplifier unit of FIG. 3. FIG. 9 illustrates a case where the verification operation is performed for a total of three times with varying the verification level. It is necessary to set the verification level between the maximum value of the distribution of the threshold voltage of the memory cell in the ERS state and the minimum value of the distribution of the threshold voltage of the memory cell in the PRG state so that the write state determination circuit 56 of FIG. 3 can accurately determine that the selected twin cell supposed to be in the write state is actually in the write state. Since the threshold voltage after being left for a long time varies due to variation of the threshold voltage in the initial state, the setting value of the verification level in order to perform a normal determination differs according to the process or the length of time it has been left. Accordingly, the verification operation is performed for a plurality of times with varying the verification level.

FIG. 10 is an explanatory drawing illustrating the result of determination on verification levels LV1 to LV3 by the write state determination circuit 56 and the result of the final verification check in FIG. 9. FIGS. 10A to 10D correspond to FIGS. 9A to 9D, respectively.

In the case immediately after erasing data, referring to FIGS. 9A and 10A, the write state determination circuit 56 determines that the selected twin cells are in the erase state for any of the verification levels LV1 to LV3. Therefore, the final determination result of the blank check indicates the erase state.

If the threshold voltage has shifted from the state immediately after erasing data, referring to FIGS. 9B and 10B, the write state determination circuit 56 determines that the twin cells are in the erase state if at least one of the twin cells is in the erase state, and thus determines that the selected twin cells are in the erase state for any of the verification levels LV1 to LV3. Therefore, the final determination result of the blank check indicates the erase state.

In the case immediately after writing data, referring to FIGS. 9C and 10C, the write state determination circuit 56 determines that the selected twin cells are in the write state for any of the verification levels LV1 to LV3. Therefore, the final determination result of the blank check indicates the write state.

If the threshold voltage has shifted from the state immediately after writing data, referring to FIGS. 9D and 10D, the determination of the write state determination circuit 56 differs according to the verification level and the initial state threshold voltage. Specifically, in the case of the shallow threshold voltage (SH), the write state determination circuit 56 determines the write state at the verification level LV2, and determines the erase state at the other verification levels LV1 and LV3. However, if the determination result of the write state determination circuit 56 falls on the write state at least once, the final determination result of the blank check indicates the write state. In the case of the deep threshold voltage (DP), the write state determination circuit 56 determines the write state at the verification level LV3, and determines the erase state at the other verification levels LV1 and LV2. However, if once the determination result of the write state determination circuit 56 falls on the write state, the final determination result of the blank check indicates the write state. As thus described, the possibility of an erroneous determination is extremely low, according to the blank check procedure of the embodiment 1 using the determination result of the write state determination circuit 56.

FIG. 11 is an explanatory drawing illustrating the determination result of a blank check performed similarly to the verification operation immediately after erasing data, without using the write state determination circuit 56. FIGS. 11A to 11D correspond to FIGS. 9A to 9D, respectively.

In the case immediately after erasing data, referring to FIGS. 9A and 11A, each memory cell is determined to be in the erase state for any of the verification levels LV1 to LV3. Therefore, the final determination result of the blank check indicates the erase state.

Referring to FIGS. 9B and 11B, if the threshold voltage has shifted from the state immediately after erasing data, the memory cell having the deep threshold voltage (SH) is determined to be in the erase state for any of the verification levels LV1 to LV3. Therefore, the final determination result of the blank check indicates the erase state. For the memory cells having the shallow threshold voltage (DP), however, an erroneous determination of the write state may be made at the verification level LV3 due to existence of a memory cell having a higher threshold voltage than the verification level LV3. Therefore, it is impossible to finally determine either the write state or the blank state.

In the case immediately after writing data, referring to FIGS. 9C and 11C, the write state is determined for any of the verification levels LV1 to LV3. Therefore, the final determination result of the blank check indicates the write state.

If the threshold voltage has shifted from the state immediately after writing data, referring to FIGS. 9D and 11D, the memory cells having the shallow threshold voltage (SH) are determined to be in the erase state at the verification level LV1, and determined to be in the write state at the verification levels LV2 and LV3. The memory cells having the deep threshold voltage (DP) are determined to be in the erase state at the verification levels LV1 and LV2, and determined to be in the write state at the verification level LV3. Therefore, it is impossible to finally determine the write state or the blank state.

As is apparent from the above result, the determination result for the memory cells having the shallow threshold voltage (SH) of FIG. 9B is identical to that for the memory cells having the deep threshold voltage (DP) of FIG. 9D. In other words, a case may occur where the erase state and the write state cannot be distinguished.

When performing the blank check according to a procedure similar to the verification operation when erasing data, without using the write state determination circuit 56, two conditions must be satisfied: (i) no erroneous determination of the write state occurs after the memory array is left for a long time with data erased thereof, and (ii) no erroneous erase state determination occurs after the memory array is left for a long time with data written therein. In order to satisfy condition (i), it is necessary to set the verification level higher than the maximum value of the threshold voltage distribution after the memory array is left for a long time after erasing data thereof. In order to satisfy condition (ii), it is necessary to set the verification level lower than the maximum value of the threshold voltage distribution of the memory cell in the PRG state after it is left for a long time after writing data therein. In FIG. 9B, it is necessary to set the verification levels to LV1 or LV2 in order to satisfy condition (i). In FIG. 9D, it is necessary to set the verification level to LV3 in order to satisfy condition (ii). As thus described, the above conditions (i) and (ii) cannot go together at the verification levels LV1 to LV3 shown in FIG. 9. Conventionally, therefore, it has been necessary to balance the above conditions (i) and (ii) by limiting the retention period to reduce the amount of shift of the threshold voltage.

With the flash memory of the embodiment 1, an accurate determination of the blank check can be performed if there exists an appropriate difference between threshold voltages of the memory cells at the positive side and the memory cells at the negative side composing the twin cell, by implementing the write state determination circuit 56 shown in FIG. 7 and employing a sequence of the blank check shown in FIG. 8. The retention characteristic is not limited for the blank check, because determination of the blank check need not be performed based on the absolute threshold voltage of the memory cell.

Although the control logic unit 20 of FIG. 3 performs the blank check determination procedure of FIG. 8 in the above embodiment, the CPU 3 of FIG. 1 may perform the blank check procedure as a third determination unit. In this case, the output OUT2 of the write state determination circuit 56 of FIG. 3 and the output OUT3 of the expected value comparison circuit 54 are output to the CPU 3 of FIG. 1 via the I/O buffer 26.

Embodiment 2

Figure 12:
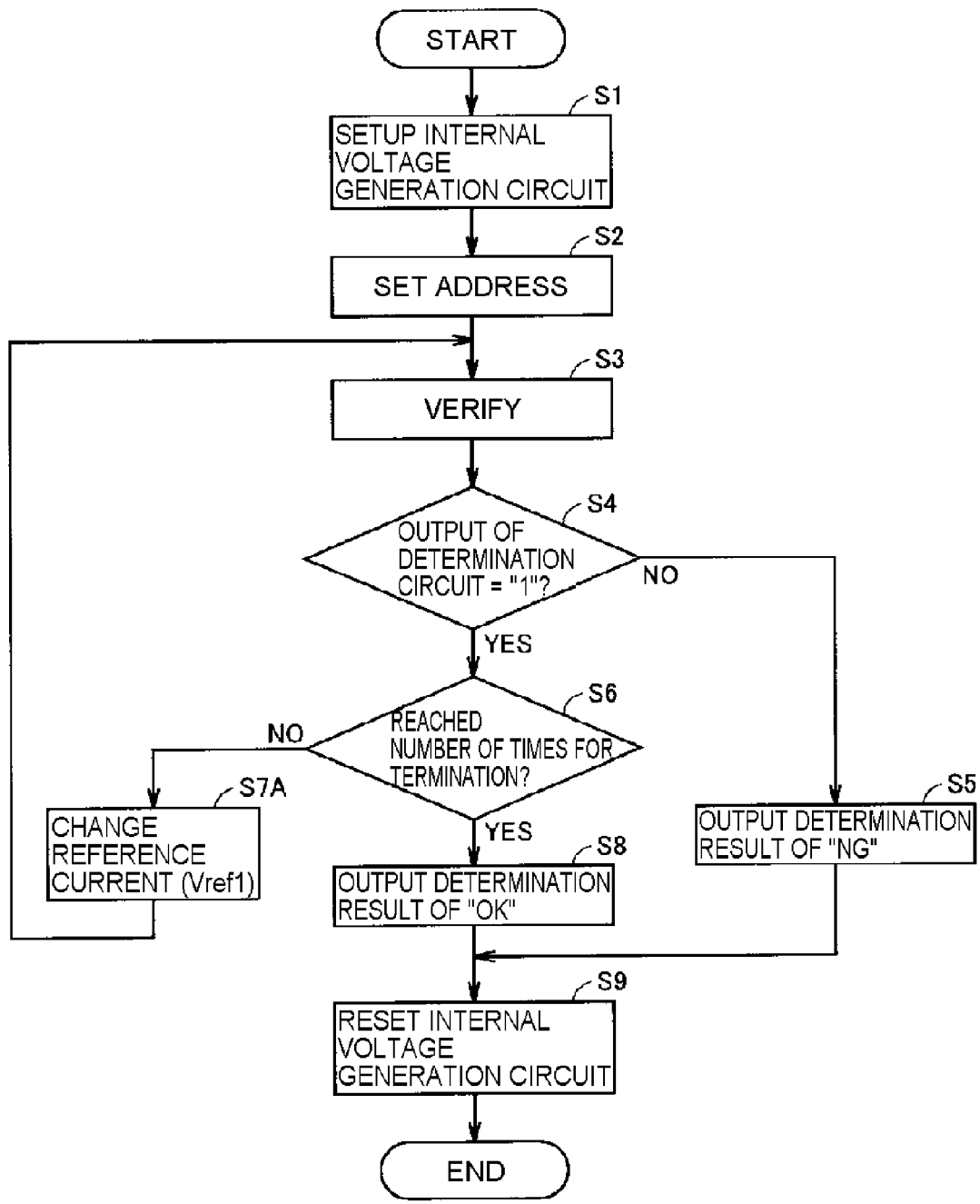
FIG. 12 is a flow chart illustrating a procedure of the blank check of the memory array performed by a semiconductor device according to an embodiment 2 of the present invention.

FIG. 12 is a flow chart illustrating a procedure of the blank check of the memory array performed by a semiconductor device according to an embodiment 2 of the present invention. The flow chart of FIG. 12 is different from the flow chart of FIG. 8 in that step S7A is included in place of step S7. Since the remaining steps are similar to those of the flow chart of FIG. 8, identical reference numerals are provided to identical or equivalent steps, with duplicate description thereof omitted.

At step S7A, the control logic unit 20 varies the voltage Vref1 supplied to the gate of the current source transistor 62 of FIG. 6, varying the reference current Iref thereby. In this case, a constant voltage is supplied to the memory gate MG of the memory cell to be blank checked. Since the verification level can be varied by equivalently varying reference current Iref, the blank check can be performed according to a procedure similar to that of the embodiment 1.

Embodiment 3

The embodiment 3 is different from the embodiment 1 in that, when performing verification by the verifying sense amplifier, the voltage being applied to the memory gate MG of each memory cell is continuously varied within a predetermined range. Since the verification level can be continuously varied by continuously varying the voltage of the memory gate MG, the blank check time can be shortened. A specific description thereof will be provided below.

Figure 13:
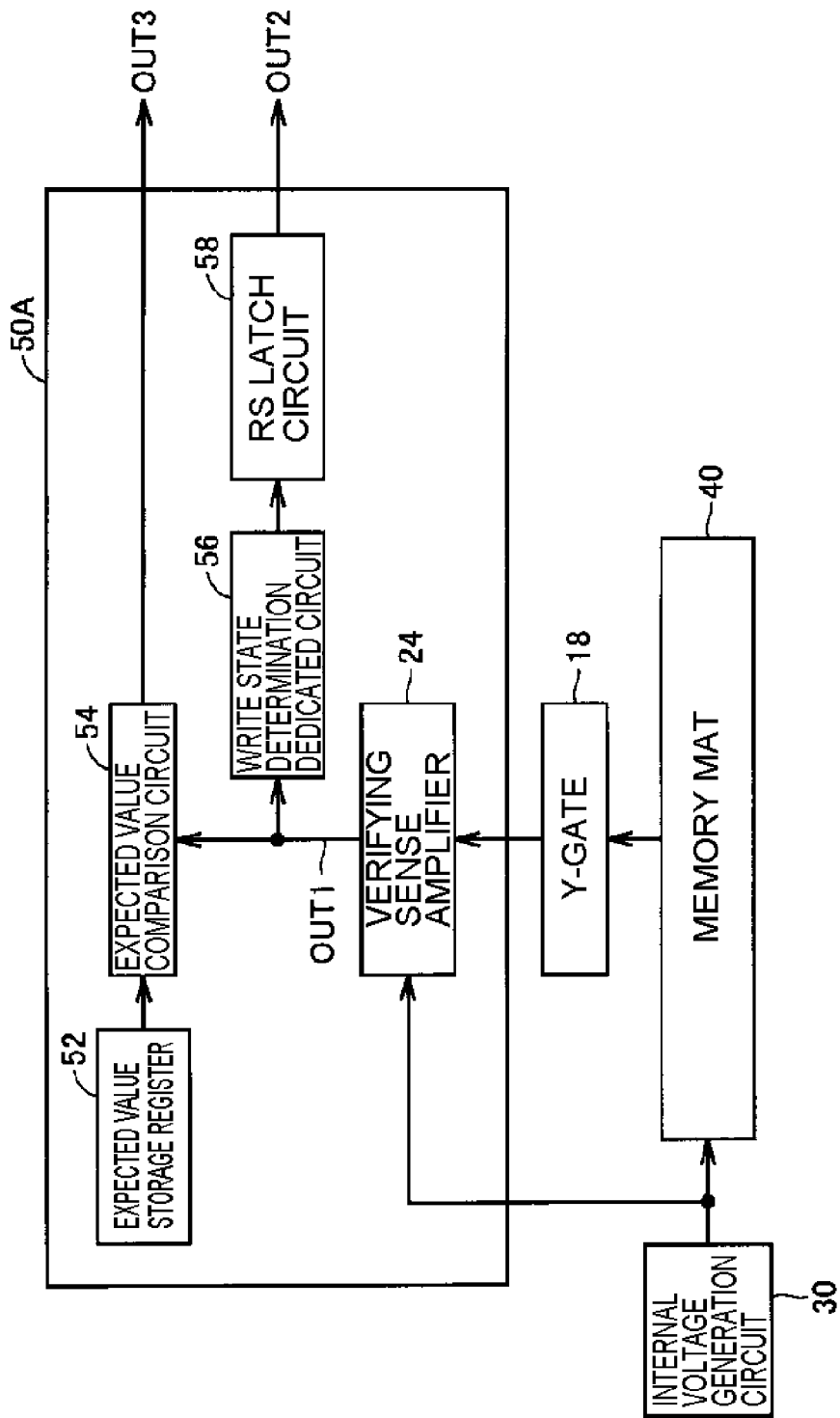
FIG. 13 is a block diagram illustrating a configuration of a circuit 50A for a verification operation and a blank check implemented by a semiconductor device according to an embodiment 3 of the present invention.

FIG. 13 is a block diagram illustrating a configuration of a circuit 50A for a verification operation and a blank check implemented by a semiconductor device according to the embodiment 3 of the present invention. The circuit 50A of FIG. 13 is different from the circuit 50 of FIG. 6 in that an RS latch circuit 58 is further included. The RS latch circuit 58 holds the output of the write state determination circuit 56 when it changes from "1" to "0". The output OUT2 of the RS latch circuit 58 is provided to the control logic unit 20 of FIG. 3. Since the remaining parts of FIG. 13 are identical to those of FIG. 5, identical reference numerals are provided to identical or equivalent members, with duplicate description thereof omitted.

Figure 14:
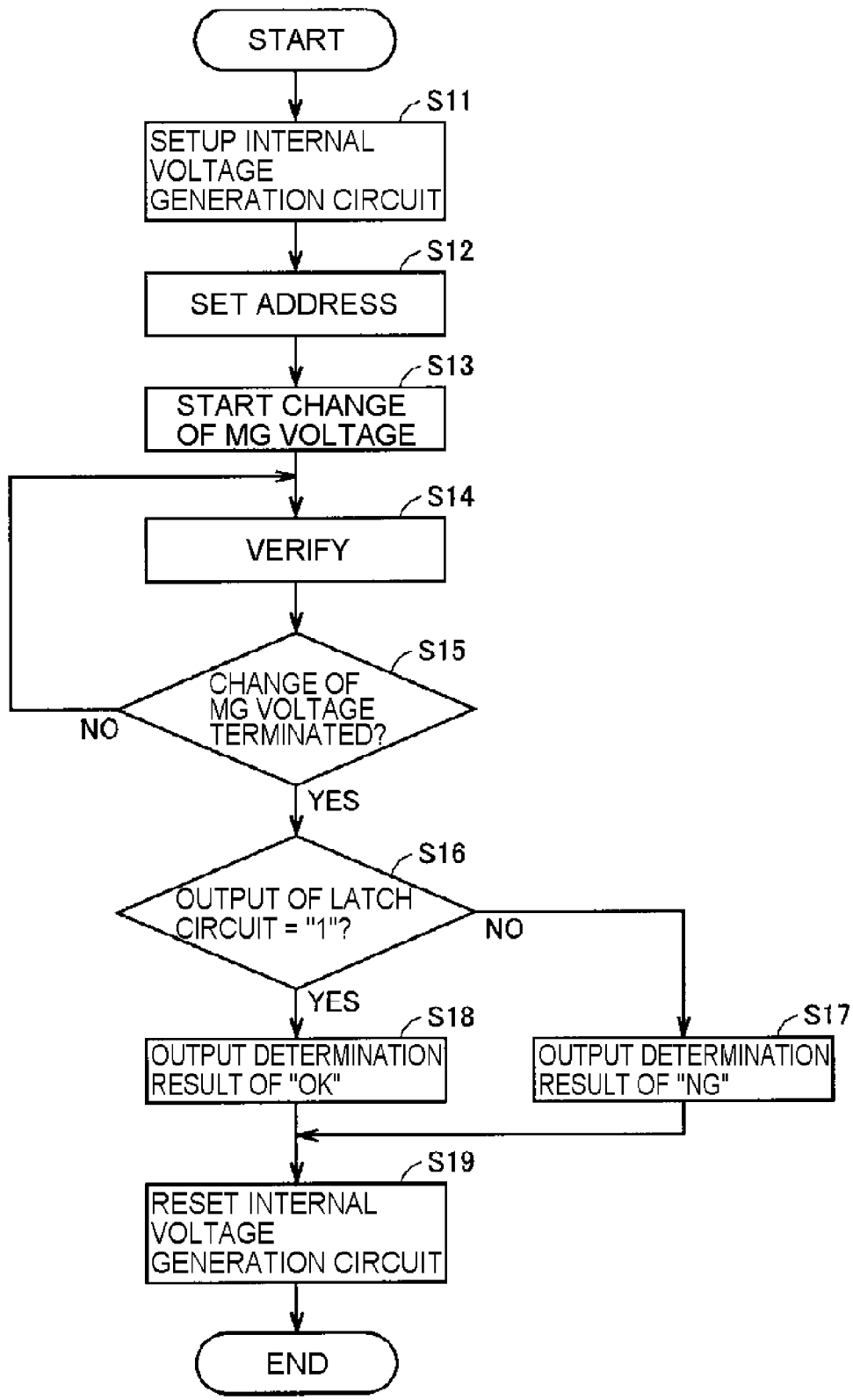
FIG. 14 is a flow chart illustrating a procedure of the blank check of the memory array performed by a semiconductor device according to the embodiment 3.

FIG. 14 is a flow chart illustrating a procedure of the blank check of the memory array performed by a semiconductor device according to the embodiment 3.

Referring to FIGS. 13 and 14, the control logic unit 20 of FIG. 3 first performs a setup operation upon receiving a blank check command from the CPU 3 or the like at step S11. The setup operation activates the internal voltage generation circuit 30 which generates an internal voltage to be output to the memory mat 40 and the verifying sense amplifier unit 24 when performing the blank check. The control logic unit 20 further initializes the number of verification times to 0, and also initializes the voltage Vmg to be applied to the memory gate MG of the memory cell to be blank checked.

At step S12, the control logic unit 20 establishes the address for performing the blank check and outputs, to the X-decoder 14 and the Y-decoder 16 of FIG. 3, control signals φX and φY specifying the twin cells to be blank checked.

At step S13, variation of the voltage Vmg being applied to the memory gate MG starts. At step S14, the verifying sense amplifier unit 24 performs verification of the memory cell to be blank checked. The output of the write state determination circuit 56 varies, according to the output result of the verifying sense amplifier. The RS latch circuit 58 holds the output of the write state determination circuit 56 when it changes from "1" to "0". Step S14 is repeated until voltage change of the memory gate MG is terminated (YES at step S15).

At step S16, the control logic unit 20 determines whether or not the output OUT2 of the RS latch circuit 58 is "1". If the output OUT2 of the RS latch circuit 58 is "1" (YES at step S16), the control logic unit 20 determines (step S18) that the memory array is in the blank state (determination result is OK), and outputs the determination result BLKCHK to the CPU 3 or the like. Subsequently, the internal voltage generation circuit 30 is shut down (step S19), and the blank check is completed.

If the output OUT2 of the RS latch circuit 58 is "0" (NO at step S16), the control logic unit 20 determines (step S17) that the memory array is in the write state (determination result is NG), and outputs the determination result BLKCHK to the CPU 3 or the like. Subsequently, the internal voltage generation circuit 30 is shut down (step S19), and the blank check is completed.

Embodiment 4

Figure 15:
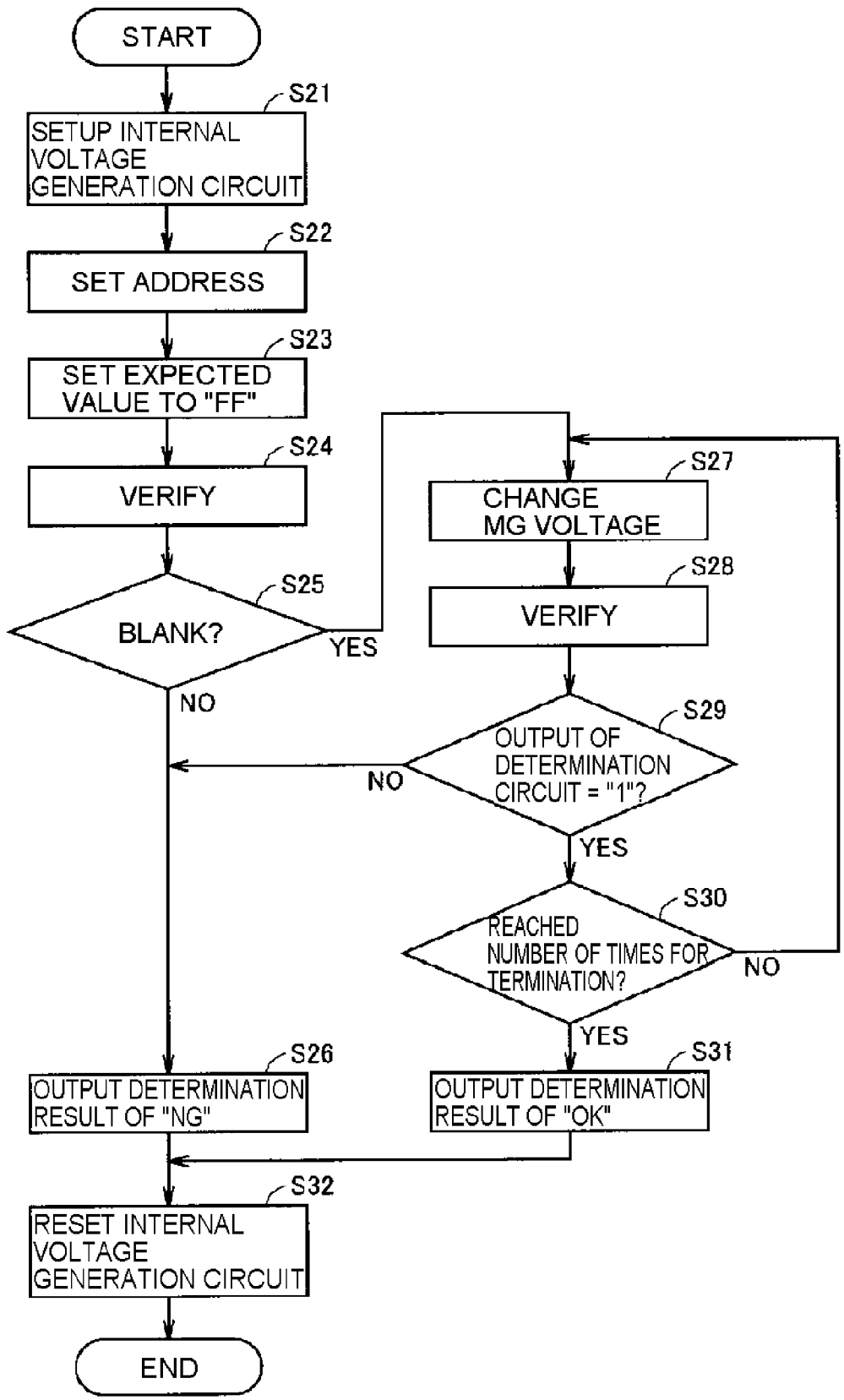
FIG. 15 is a flow chart illustrating a procedure of the blank check of the memory array performed by a semiconductor device according to an embodiment 4 of the present invention.

FIG. 15 is a flow chart illustrating a procedure of the blank check of the memory array performed by a semiconductor device according to an embodiment 4 of the present invention. The blank check procedure of FIG. 15 is different from FIG. 8 in that the blank check is performed by combining the determination result OUT3 by the expected value comparison circuit 54 of FIG. 3 and the determination result OUT2 by the write state determination circuit 56. In this manner, erroneously determining the blank check result as the erase state can be avoided when the threshold voltage of the memory cells composing the twin cells is high both at the positive side and the negative side. A specific description thereof will be provided below.

Referring to FIGS. 3 and 15, the control logic unit 20 first performs a setup operation upon receiving a blank check command from the CPU 3 of FIG. 1 at step S21. The setup operation activates the internal voltage generation circuit 30 which generates an internal voltage to be output to the memory mat 40 and the verifying sense amplifier unit 24 when performing the blank check. The control logic unit 20 further initializes the number of verification times to 0, and initializes the voltage Vmg to be applied to the memory gate MG of a memory cell to be blank checked.

At step S22, the control logic unit 20 establishes the address for performing the blank check and outputs, to the X-decoder 14 and the Y-decoder 16, control signals φX and φY specifying the twin cells to be blank checked.

At step S23, the control logic unit 20 sets the expected value to be stored in the expected value storage register 52 to "FFh" (h expresses a hexadecimal). In other words, all the expected values of the 128 memory cells to be blank checked becomes "1" (low threshold voltage state for the N channel).

At step S24, the verifying sense amplifier unit 24 performs verification of the memory cells to be blank checked. The determination result OUT3 of the expected value comparison circuit 54 is established, according to the output result of verifying sense amplifier.

At step S25, the control logic unit 20 determines whether or not the output result of the verifying sense amplifier matches the expected value "FFh", that is, all the memory cells to be blank checked are in the blank state. If they are in the blank state (YES at step S25), the process flow advances to step S27. If at least one of the memory cells is in the write state (NO at step S25), the control logic unit 20 determines (step S26) that a plurality of selected twin cells are in the write state (determination result is NG), and outputs the determination result BLCHK to the CPU 3 of FIG. 1. Subsequently, the internal voltage generation circuit 30 is shut down (step S32), and the blank check is completed.

At step S27, the voltage Vmg being applied to the memory gate MG of the memory cell to be blank checked is varied.

At step S28, the verifying sense amplifier unit 24 performs verification of the memory cell to be blank checked. The determination result OUT2 of the write state determination circuit 56 is established, according to the output result of verifying sense amplifier.

At step S29, the control logic unit 20 determines whether or not the output OUT2 of the write state determination circuit 56 is "1" (blank state). If the determination result of the write state determination circuit 56 is "0" (NO at step S29), the control logic unit 20 determines (step S26) that a plurality of selected twin cells are in the write state (determination result is NG), and outputs the determination result BLCHK to the CPU 3 of FIG. 1. Subsequently, the internal voltage generation circuit 30 is shut down (step S32), and the blank check is completed.

If, at step S29, the output OUT2 of the write state determination circuit 56 is "1" (YES at step S29), the control logic unit 20 determines that a plurality of selected twin cells are not in the write state, and advances the process flow to step S30.

At step S30, the control logic unit 20 determines whether or not the number of verification times has reached the predetermined number of times for termination. If the number of verification times has reached the predetermined number of times for termination (YES at step S30), the control logic unit 20 determines (step S31) that the memory array is in the blank state (determination result is OK), and outputs the determination result BLKCHK to the CPU 3. Subsequently, the internal voltage generation circuit is shut down (step S32), and the blank check is completed.

If, at step S30, the number of verification times has not reached the predetermined number of times for termination (NO at step S30), the control logic unit 20 advances the process flow to step S27, and the procedures after step S27 are repeated.

Although the memory cell is assumed to be an N channel in the above embodiments, it may be a P channel. In this case, the sign of the threshold voltage, as well as the sign of the voltage being applied to the bit line BL, the word line WL, the memory gate line MGL, and the source line SL are the reverse of those for an N channel.

It should be noted that the disclosed embodiments are in all respects illustrative and not limiting the invention. It is intended that the scope of the invention is defined by the claims and not by the foregoing description, and any modification thereof is included in the scope of the claims as well as the meaning and range of equivalence.

What is claimed is:
1. A semiconductor device comprising:
   a memory array having a plurality of memory cells provided therein each having a transistor with a variable threshold voltage, the memory cells included in the memory array being grouped into a plurality of twin cells each having two memory cells, each of the twin cells storing complementary data, with the threshold voltage of one memory cell being set higher than that of the other memory cell;
   a selection circuit which selects a plurality of selected twin cells forming a part of the twin cells;
   a first determination unit which determines, for each of the selected twin cells, whether or not a first condition that the threshold voltage of one memory cell is higher than a reference value commonly set for the selected twin cells and the threshold voltage of the other memory cell is lower than the reference value is satisfied;
   a second determination unit which determines whether or not a second condition that all the selected twin cells satisfy the first condition is satisfied; and
   a third determination unit which determines, based on the determination result of the second determination unit, whether or not each of the selected twin cells is in a blank state in which no complementary data is stored.

2. The semiconductor device according to claim 1, wherein the third determination unit continuously or discretely varies the reference value within a predetermined range and, if the second condition is not satisfied for any size of the reference value, each of the selected twin cells is determined to be in the blank state.

3. The semiconductor device according to claim 2, wherein the transistor has a channel region provided over a semiconductor substrate, an electric charge accumulation unit formed over the channel region via an insulating film, and a gate electrode formed over the electric charge accumulation unit via an insulating film,
   a threshold voltage of the transistor varies according to an electric charge accumulated in the electric charge accumulation unit,
   the semiconductor device further comprises:
      an internal voltage generation unit which generates a control voltage that varies according to the reference value and supplies it to the gate electrode of each memory cell included in the selected twin cells; and
      a voltage comparison unit which compares, for each memory cell included in the selected twin cells, a current flowing in the transistor with a predetermined reference current, when the control voltage is applied to the gate electrode, and
   the first determination unit determines, based on a comparison result of the voltage comparison unit, whether or not the first condition is satisfied.

4. The semiconductor device according to claim 2, wherein the transistor has a channel region provided over a semiconductor substrate, an electric charge accumulation unit formed over the channel region via an insulating film, and a gate electrode formed over the electric charge accumulation unit via an insulating film,
   a threshold voltage of the transistor varies according to an electric charge accumulated in the electric charge accumulation unit, the semiconductor device further comprises:
- an internal voltage generation unit which generates a predetermined control voltage and supplies it to the gate electrode of each memory cell included in the selected twin cells; and
- a voltage comparison unit which compares, for each memory cell included in the selected twin cells, a current flowing in the transistor with a reference current that varies according to the reference value, when the control voltage is applied to the gate electrode, and
- the first determination unit determines, based on a comparison result of the voltage comparison unit, whether or not the first condition is satisfied.

5. The semiconductor device according to claim 1, wherein the transistor is an N-channel transistor, the third determination unit continuously or discretely varies the reference value within a predetermined range and, if the second condition is not satisfied for any size of the reference values and, for at least one of the reference values, the threshold voltage of all the memory cells included in the selected twin cells is lower than the reference value, determines that each of the selected twin cells is in the blank state.

6. The semiconductor device according to claim 1 wherein the transistor is a P-channel transistor, the third determination unit continuously or discretely varies the reference value within a predetermined range and, if the second condition is not satisfied for any size of the reference values and, for at least one of the reference values, the threshold voltage of all the memory cells included in the selected twin cells is higher than the reference value, determines that each of the selected twin cells is in the blank state.

* * * * *